(12) United States Patent
Lin et al.

(10) Patent No.: US 8,722,540 B2
(45) Date of Patent: May 13, 2014

(54) CONTROLLING DEFECTS IN THIN WAFER HANDLING

(75) Inventors: Yu-Liang Lin, Hsin-Chu (TW); Weng-Jin Wu, Hsin-Chu (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 344 days.

(21) Appl. No.: 12/841,874

(22) Filed: Jul. 22, 2010

(65) Prior Publication Data
US 2012/0021604 A1 Jan. 26, 2012

(51) Int. Cl.
*H01L 21/302* (2006.01)
*H01L 21/461* (2006.01)

(52) U.S. Cl.
USPC ............... 438/692; 216/57; 216/83; 438/455; 438/704

(58) Field of Classification Search
USPC ............. 134/140; 156/85; 257/737; 428/354, 428/107, 108, 113, 458, 460, 692; 445/24
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,558,478 B1 * | 5/2003 | Katakabe et al. ............... 134/33 |
| 6,599,778 B2 | 7/2003 | Pogge et al. |
| 6,638,865 B2 | 10/2003 | Tanaka |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |

(Continued)

FOREIGN PATENT DOCUMENTS

| | | |
|---|---|---|
| CN | 1348208 A | 5/2002 |
| CN | 1885500 A | 12/2006 |

*Primary Examiner* — Duy Deo
*Assistant Examiner* — Erin Bergner
(74) *Attorney, Agent, or Firm* — Slater & Matsil, L.L.P.

(57) ABSTRACT

A method includes bonding a wafer on a carrier through an adhesive, and performing a thinning process on the wafer. After the step of performing the thinning process, a portion of the adhesive not covered by the wafer is removed, while the portion of the adhesive covered by the wafer is not removed.

19 Claims, 2 Drawing Sheets

(56) References Cited

U.S. PATENT DOCUMENTS

| | | |
|---|---|---|
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,410,908 B2 | 8/2008 | Hara |
| 7,883,991 B1 * | 2/2011 | Wu et al. ............ 438/459 |
| 2002/0042189 A1 * | 4/2002 | Tanaka ............ 438/450 |
| 2005/0136622 A1 * | 6/2005 | Mulligan et al. ............ 438/460 |
| 2005/0158913 A1 * | 7/2005 | Kouda et al. ............ 438/113 |
| 2005/0217707 A1 * | 10/2005 | Aegerter et al. ............ 134/33 |
| 2006/0211220 A1 * | 9/2006 | Sakaya et al. ............ 438/464 |
| 2006/0292887 A1 * | 12/2006 | Hara ............ 438/753 |

\* cited by examiner

CONTROLLING DEFECTS IN THIN WAFER HANDLING

TECHNICAL FIELD

This disclosure relates generally to integrated circuit manufacturing processes, and more particularly to the methods of controlling defects generated during thin wafer handling.

BACKGROUND

Integrated circuits are formed on semiconductor wafers. The semiconductor wafers are then sawed into chips. The formation of integrated circuits includes many process steps such as deposition, chemical mechanical polish (CMP), plating, and the like. Accordingly, wafers are transported between different equipments.

A challenge faced by integrated circuit manufacturing industry is that to improve cost efficiency, wafers become increasingly larger. In the meantime, wafers also become increasingly thinner. Therefore, the thin wafers suffer from breakage, particularly during the transportation and the CMP process, during which mechanical stress may be applied to the wafers.

To reduce the likelihood of breakage, thin wafers may need to be strengthened. In conventional processes, in order to perform wafer thinning, a carrier is bonded to the wafers first, and then the wafer is thinned, for example, through a backside grinding step. The bonding between the carrier and the wafer is performed through an adhesive. After the wafer thinning process, additional process steps may be performed on the wafer. The additional process steps may include dry etches, physical vapor depositions (PVDs), plasma enhanced chemical vapor depositions (PECVDs), which process steps involve the use of plasma. The plasma interacts with the exposed portions of the adhesive, and may cause bubbles to be generated in the adhesive. The generated bubbles may apply upward forces to the wafer, and the upward forces may not be uniformly applied to different parts of the respective wafer. Accordingly, in subsequent process steps, the total wafer thickness variation (TTV) of the wafer is adversely affected. Further, the bubbles may cause some portions of the adhesive to be pushed to a level higher than the top surface of the wafer, and the subsequent manufacturing processes are affected.

SUMMARY

In accordance with one aspect, a method includes bonding a wafer on a carrier through an adhesive, and performing a thinning process on the wafer. After the step of performing the thinning process, a portion of the adhesive not covered by the wafer is removed, while the portion of the adhesive covered by the wafer is not removed.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method of controlling defects generated in thin wafer handling is provided in accordance with embodiments. The intermediate stages of the embodiments are illustrated. Throughout the various views and illustrative embodiments, like reference numbers are used to designate like elements.

Figure 1A:
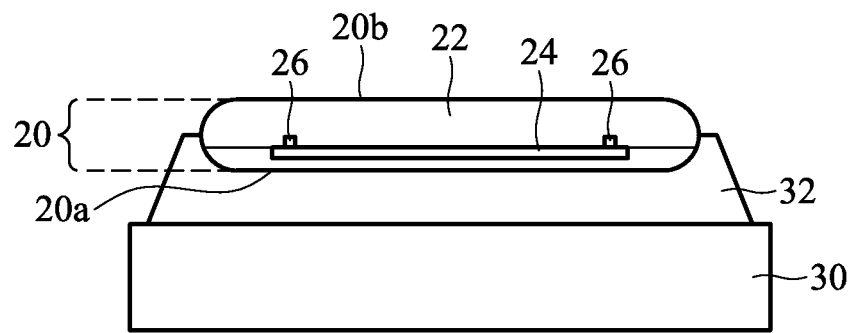
FIGS. 1A through 4 are cross-sectional views of intermediate stages of a wafer thinning process in accordance with embodiments.
Figure 1B:
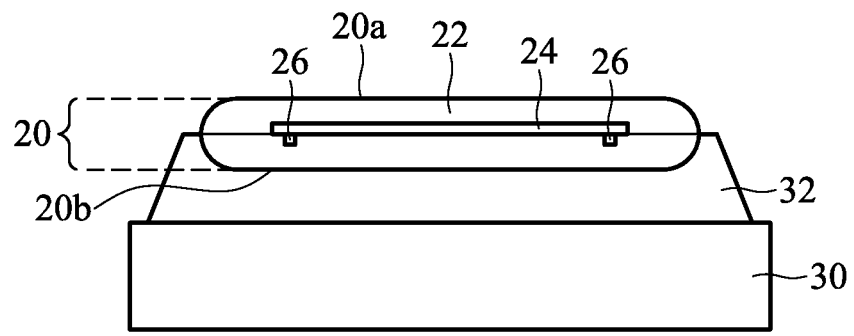

Referring to FIGS. 1A and 1B, wafer 20 is provided, and is bonded to carrier 30 through adhesive 32. In an embodiment, wafer 20 is a device wafer including semiconductor substrate 22 and integrated circuit 24 therein. Integrated circuit 24 may include active devices such as transistors and passive devices such as resistors, capacitors, and the like. Through-substrate vias (TSVs) 26 may be formed in wafer 20. TSVs 26 extend into semiconductor substrate 22, and are electrically coupled to integrated circuit 24. In an embodiment, semiconductor substrate 22 is a silicon substrate, although it may be formed of other semiconductor materials.

In accordance with an embodiment, as shown in FIG. 1A, the front surface 20a of wafer 20 faces down to contact adhesive 32. Accordingly, back surface 20b of wafer 20 may also be the back surface of semiconductor substrate 22. The subsequent thinning process of wafer 20 is thus a backside grinding process. In alternative embodiments as shown in FIG. 1B, the front surface 20a of wafer 20 faces up, wherein the subsequent thinning process of wafer 20 may be a chemical mechanical polish (CMP).

Wafer 20 may also be another type of wafer such as an interposer wafer, which is free from active devices such as transistors therein. However, passive devices such as resistors and capacitors may be formed in wafer 20. Alternatively, wafer 20 may be a wafer of package substrates.

Adhesive 32 may comprise rubber, acrylic, silicone, or combinations thereof. Further, adhesive 32 may be a ultra-violet (UV) adhesive, which may lose adhesion when exposed to a UV light. Carrier 30 may be a glass wafer, although other types of commonly used carriers may be used.

Figure 2:
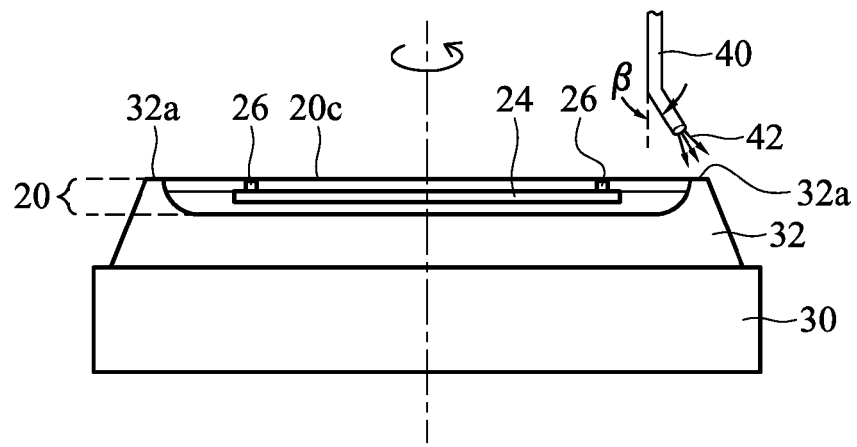

Referring to FIG. 2, wafer 20 is thinned through a wafer thinning process, which may be a CMP process or a backside grinding process. In the embodiments wherein a backside grinding is performed, TSVs 26 may be exposed after the wafer thinning process. In an embodiment, during the wafer thinning process, portions of adhesive 32 are also polished, and surface 20c of wafer 20 is level with flat top surface(s) 32a of the remaining portion of adhesive 32. It is observed that the remaining adhesive 32 includes portions not covered by wafer 20, and a portion directly under, and covered by, wafer 20.

Next, portions of adhesive 32 not covered by wafer 20 are removed. As also illustrated in FIG. 2, the thinned wafer 20 is rotated, for example, with the axis of the rotation crossing a center of wafer 20. Nozzle 40 is used to spray chemical 42 onto adhesive 32. Nozzle 40 may be located at a fixed position. With the rotation of wafer 20, chemical 42 may be sprayed to all of exposed portions of adhesive 32 encircling wafer 20. Chemical 42 is used to remove adhesive 32, and may comprise a solvent (and/or a thinner) for dissolving adhesive 32. In an exemplary embodiment, chemical 42 comprises a solvent, alcohol, or a thinner. With the rotation of wafer 20, the dissolved adhesive 32 along with chemical 42 is spinned off.

Figure 3:
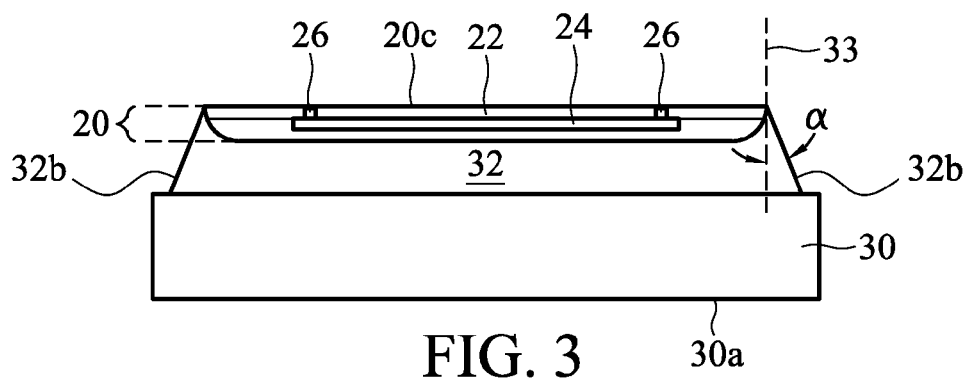

FIG. 3 illustrates the resulting structure after the spray of chemical 42. Surfaces 32a (FIG. 2) of adhesive 32 is at least reduced in size, and may be substantially eliminated. However, the portion of adhesive 32 directly under, and is covered by, wafer 20 is not removed. Sidewalls 32b of the remaining portion of adhesive 32 may be slanted, and the tilt angle α, which is the angle between sidewalls 32b of adhesive 32 and vertical line 33, may be between about 40 degrees and about 80 degrees, although tilt angle α may be greater or smaller. Vertical line 33 is perpendicular to major surface 20c of wafer 20 and major surface 30a of carrier 30. Accordingly, as shown in FIG. 2, nozzle 40 may spray chemical 42 at tilt angle β, which is between about 15 degrees and about 70 degrees, for example. Nozzle 40 may also spray chemical 42 in the vertically downward direction. No undercuts, or substantially no undercuts, are formed in the portion of adhesive 32 directly under wafer 20. Therefore, wafer 20 is well supported by adhesive 32.

Figure 4:
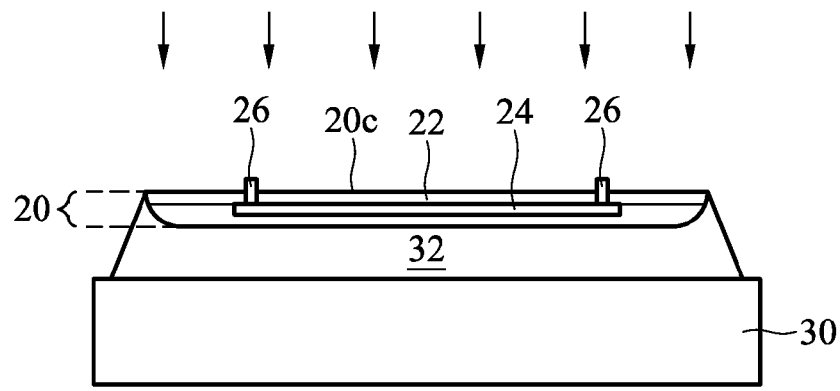

Additional processes may then be performed on wafer 20, which processes may include a CMP, a deposition, a dry etch, and/or the like. These processes may involve the use of plasma. FIG. 4 illustrates an exemplary dry etch step for etching substrate 22 so that TSVs 26 may protrude out of surface 20c, wherein arrows symbolize the plasma. It is observed that since adhesive 32 is substantially free from any top surface that is at the same level as surface 20c of wafer 20, the possibility of generating bubbles as a result of the plasma in adhesive 32 is reduced. Further, even if bubbles are generated, the bubbles are unlikely to cause the unevenness of wafer 20.

It is observed that with the using of the embodiments, there was no degradation of total wafer thickness variation (TTV) observed. Experiments have revealed that before the plasma process as shown in FIG. 4 is performed, a TTV of a sample wafer is about 6.75 µm. After the plasma process, the TTV is about 4.13 µm. As a comparison, if the embodiments are not used, and exposed surface of adhesive 32 is not removed and is subject to the plasma, the TTVs measured before and after the plasma process were 6.1 µm and 17.16 µm, respectively, which indicate that the plasma process resulted in a significant degradation in the TTV of the respective sample wafer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    bonding a wafer on a carrier through an adhesive;
    after the step of bonding the wafer, performing a thinning process on the wafer; and
    after the step of performing the thinning process, removing a portion of the adhesive not covered by the wafer, wherein a portion of the adhesive covered by the wafer is not removed, wherein any plasma processes performed after the step of performing the thinning process is also performed after the removing the portion of the adhesive, and wherein the removing the portion of the adhesive comprises rotating the wafer.

2. The method of claim 1, wherein the step of removing the portion of the adhesive comprising spraying a chemical to the portion of the adhesive not covered by the wafer, and wherein the chemical is configured to dissolve the adhesive.

3. The method of claim 2 further comprising, at a time the step of spraying the chemical is performed, simultaneously rotating the wafer, wherein a nozzle for spraying the chemical is at a fixed position.

4. The method of claim 2, wherein the chemical is selected from the group consisting essentially of a solvent, alcohol, a thinner, and combinations thereof.

5. The method of claim 1 further comprising, after the step of removing the portion of the adhesive, performing a process step to the wafer, with plasma used in the process step, wherein the wafer is bonded to the carrier through the adhesive during the process step, and wherein the process step is selected from the group consisting essentially of a deposition and a dry etch.

6. The method of claim 1, wherein at a time the step of removing the portion of the adhesive is started, the adhesive comprises a top surface level with a top surface of the wafer, and wherein after the step of removing the portion of the adhesive, the top surface of the adhesive is at least reduced in size.

7. The method of claim 6, wherein after the step of removing the portion of the adhesive, the top surface of the adhesive is substantially eliminated.

8. The method of claim 1, wherein after the step of removing the portion of the adhesive, a remaining portion of the adhesive comprises a slanted sidewall having a tilt angle between about 40 degrees and about 80 degrees, with the tilt angle being measured as between the slanted sidewall and a line perpendicular to a major surface of the carrier.

9. The method of claim 1, wherein after the step of removing the portion of the adhesive, no undercut is formed in the adhesive and extending directly under the wafer.

10. A method comprising:
    bonding a wafer on a carrier, with the wafer and the carrier being bonded on opposite sides of an adhesive;
    after the step of bonding the wafer, performing a thinning process to the wafer; and
    after the step of performing the thinning and prior to any plasma processes performed after the step of performing the thinning, dissolving portions of the adhesive not covered by the wafer by:
        rotating the wafer; and
        at a time the wafer is rotated, spraying a chemical to the portions of the adhesive not covered by the wafer, wherein the chemical is configured to dissolve the adhesive, and wherein a portion of the adhesive covered by the wafer is not removed during the step of spraying the chemical.

11. The method of claim 10, wherein during the step of performing the thinning process, a portion of the adhesive is removed, with a remaining portion of the adhesive having a flat top surface level with a top surface of a remaining portion of the wafer, and wherein during the step of spraying the chemical, the flat top surface of the adhesive is substantially removed.

12. The method of claim 10, wherein after the step of spraying the chemical, a remaining portion of the adhesive comprises a slanted sidewall having a tilt angle between about 40 degrees and about 80 degrees, with the tilt angle being between the slanted sidewall and a line perpendicular to a major surface of the carrier.

13. The method of claim 10, wherein after the step of spraying the chemical, no undercut is formed in the adhesive and extending directly under the wafer.

14. The method of claim 10, wherein the chemical is selected from the group consisting essentially of a solvent, alcohol, a thinner, and combinations thereof.

15. A method comprising:
bonding a wafer on a carrier through an adhesive;
after the step of bonding the wafer, performing a thinning process to the wafer, wherein during the step of performing the thinning process, a portion of the adhesive is removed, with a remaining portion of the adhesive having a top surface level with a top surface of the wafer;
after the step of performing the thinning and prior to any plasma processes performed after the step of performing the thinning, removing portions of the adhesive not covered by the wafer by:
rotating the wafer;
pointing a nozzle to the top surface of the adhesive; and
at a time the wafer is rotated, spraying a chemical using the nozzle to the top surface of the adhesive to remove the portions of the adhesive not covered by the wafer, wherein a portion of the adhesive covered by the wafer is not removed; and
after the step of spraying the chemical, performing a process step to the wafer, with plasma used in the process step, wherein the wafer is bonded to the carrier through the adhesive during the process step.

16. The method of claim 15, wherein during the step of spraying the chemical, the nozzle for spraying the chemical is at a fixed position with a fixed tilt angle.

17. The method of claim 16, wherein the fixed tilt angle is between about 15 degrees and about 70 degrees.

18. The method of claim 17, wherein after the step of spraying the chemical, a remaining portion of the adhesive not removed during the step of spraying the chemical comprises a sidewall having a tilt angle between about 40 degrees and about 80 degrees.

19. The method of claim 17, wherein after the step of spraying the chemical, no undercut is formed in the adhesive and extending directly under the wafer.

* * * * *